(12) United States Patent
Vikstedt et al.

(10) Patent No.: US 10,484,110 B2
(45) Date of Patent: Nov. 19, 2019

(54) METHOD AND SYSTEM FOR TESTING BEAM FORMING CAPABILITIES OF WIRELESS DEVICES

(71) Applicant: ETS-Lindgren Inc., Cedar Park, TX (US)

(72) Inventors: Jari Vikstedt, Georgetown, TX (US); Michael David Foegelle, Cedar Park, FL (US)

(73) Assignee: ETS-Lindgren, Inc., Cedar Park, TX (US)

( * ) Notice: Subject to any disclaimer, the term of this patent is extended or adjusted under 35 U.S.C. 154(b) by 0 days.

(21) Appl. No.: 16/414,231

(22) Filed: May 16, 2019

(65) Prior Publication Data

US 2019/0273566 A1    Sep. 5, 2019

Related U.S. Application Data

(63) Continuation of application No. 15/892,042, filed on Feb. 8, 2018, now Pat. No. 10,333,632.

(60) Provisional application No. 62/480,937, filed on Apr. 3, 2017.

(51) Int. Cl.
| | |
|---|---|
| *H04B 17/16* | (2015.01) |
| *G01R 31/00* | (2006.01) |
| *G01R 29/08* | (2006.01) |
| *H04W 24/06* | (2009.01) |
| *G01R 29/10* | (2006.01) |

(Continued)

(52) U.S. Cl.
CPC ......... *H04B 17/16* (2015.01); *G01R 29/0814* (2013.01); *G01R 29/0871* (2013.01); *G01R 29/0878* (2013.01); *G01R 29/105* (2013.01); *G01R 31/001* (2013.01); *H04B 17/0085* (2013.01); *H04W 24/06* (2013.01); *H04B 7/0617* (2013.01)

(58) Field of Classification Search
CPC .. H04B 17/16; H04B 17/0085; H04B 7/0617; H04W 24/06; G01R 29/0878; G01R 29/0814; G01R 29/0871; G01R 29/105
See application file for complete search history.

(56) References Cited

U.S. PATENT DOCUMENTS 6,191,744 B1    2/2001    Snow et al.
6,492,955 B1 *  12/2002   Amyotte ............ H01Q 3/20
                                             343/755

(Continued)

FOREIGN PATENT DOCUMENTS

JP        2003043083 A      2/2003

OTHER PUBLICATIONS

European Search Report and Written Opinion dated Apr. 10, 2018, for corresponding International Application No. EP 18164482.4; International Filing Date: Mar. 28, 2018 consisting of 7-pages.

*Primary Examiner* — Devan A Sandiford
(74) *Attorney, Agent, or Firm* — Christopher & Weisberg, P.A.

(57) ABSTRACT

In some embodiments, a positioning system is configured to position a plurality of antennas about a device under test (DUT). According to one embodiment, a positioning system includes a first positioner configured to hold a DUT and to provide motion of the DUT about a first axis, and a second positioner configured to hold a first antenna and to provide motion of the first antenna about a second axis.

8 Claims, 14 Drawing Sheets

(51) Int. Cl.
  *H04B 17/00* (2015.01)
  *H04B 7/06* (2006.01)

(56) References Cited

U.S. PATENT DOCUMENTS

| | | | | |
|---|---|---|---|---|
| 6,850,851 B1* | 2/2005 | Fourestie | | G01R 29/0814 |
| | | | | 324/76.11 |
| 7,791,355 B1 | 9/2010 | Esher et al. | | |
| 7,876,276 B1* | 1/2011 | Zaman | | H01Q 3/08 |
| | | | | 343/703 |
| 8,047,518 B2* | 11/2011 | Grange | | H01Q 3/02 |
| | | | | 269/289 MR |
| 8,335,347 B2* | 12/2012 | Grange | | G01S 5/163 |
| | | | | 382/103 |
| 8,482,294 B2 | 7/2013 | Garreau et al. | | |
| 9,094,056 B2* | 7/2015 | Ouyang | | H04B 17/373 |
| 9,613,465 B1* | 4/2017 | Tsai | | G01B 11/303 |
| 9,614,627 B2* | 4/2017 | Yu | | H04B 17/0085 |
| 9,906,315 B1* | 2/2018 | Bartko | | H04B 17/102 |
| 9,991,591 B1* | 6/2018 | Rowell | | H01Q 3/267 |
| 9,991,592 B1* | 6/2018 | Rowell | | H01Q 3/267 |
| 10,044,104 B1* | 8/2018 | Bartko | | H01Q 3/267 |
| 10,085,162 B2* | 9/2018 | Foegelle | | H04B 7/0617 |
| 10,306,494 B2* | 5/2019 | Foegelle | | H04B 7/0617 |
| 10,333,632 B2* | 6/2019 | Vikstedt | | G01R 29/0814 |
| 2002/0040466 A1* | 4/2002 | Khazei | | G01R 31/001 |
| | | | | 716/115 |
| 2005/0176375 A1* | 8/2005 | Bednasz | | G01R 29/10 |
| | | | | 455/67.12 |
| 2006/0194553 A1* | 8/2006 | Ozaki | | G01R 29/10 |
| | | | | 455/226.1 |
| 2007/0096763 A1* | 5/2007 | Ehrmann | | G01R 31/2891 |
| | | | | 324/750.23 |
| 2008/0129615 A1* | 6/2008 | Breit | | G01R 29/105 |
| | | | | 343/703 |
| 2009/0000136 A1* | 1/2009 | Crampton | | B25J 13/088 |
| | | | | 33/503 |
| 2009/0295405 A1* | 12/2009 | Pommerenke | | G01R 29/0878 |
| | | | | 324/627 |
| 2010/0005670 A1* | 1/2010 | Tsai | | G01R 29/0871 |
| | | | | 33/228 |
| 2010/0045543 A1* | 2/2010 | Kitada | | G01R 29/105 |
| | | | | 343/703 |
| 2010/0156896 A1* | 6/2010 | Ichimura | | G01B 11/245 |
| | | | | 345/419 |
| 2010/0171650 A1* | 7/2010 | Okano | | H04B 7/04 |
| | | | | 342/173 |
| 2010/0171669 A1* | 7/2010 | Ito | | G01R 29/10 |
| | | | | 343/703 |
| 2011/0084887 A1* | 4/2011 | Mow | | G01R 29/10 |
| | | | | 343/703 |
| 2011/0095950 A1* | 4/2011 | Yu | | H04W 24/06 |
| | | | | 343/703 |
| 2011/0100098 A1* | 5/2011 | Lauger | | G01N 11/142 |
| | | | | 73/54.28 |
| 2011/0121839 A1* | 5/2011 | Gandois | | G01R 29/0821 |
| | | | | 324/629 |
| 2011/0294437 A1* | 12/2011 | Freiherr Von Gagern | | |
| | | | | H04B 17/336 |
| | | | | 455/67.11 |
| 2012/0038522 A1* | 2/2012 | Miyata | | G01R 29/10 |
| | | | | 343/703 |
| 2012/0286799 A1 | 11/2012 | Partee et al. | | |
| 2013/0093447 A1* | 4/2013 | Nickel | | H04W 24/06 |
| | | | | 324/750.16 |
| 2013/0271317 A1* | 10/2013 | Goel | | G01S 19/23 |
| | | | | 342/357.62 |
| 2014/0087668 A1* | 3/2014 | Mow | | H04B 17/318 |
| | | | | 455/67.14 |
| 2014/0091961 A1* | 4/2014 | Foegelle | | G01R 29/10 |
| | | | | 342/1 |
| 2014/0104092 A1 | 4/2014 | Burnett, II et al. | | |
| 2014/0141726 A1* | 5/2014 | Schlub | | G01R 29/0857 |
| | | | | 455/67.12 |
| 2014/0226167 A1* | 8/2014 | Smith | | G03B 21/14 |
| | | | | 356/614 |
| 2014/0256267 A1* | 9/2014 | Chien | | G01R 29/105 |
| | | | | 455/67.12 |
| 2014/0256373 A1* | 9/2014 | Hernandez | | H04B 17/12 |
| | | | | 455/509 |
| 2014/0267624 A1* | 9/2014 | Hara | | G01B 11/2504 |
| | | | | 348/46 |
| 2014/0306843 A1* | 10/2014 | Merkel | | G01S 3/14 |
| | | | | 342/385 |
| 2014/0307568 A1* | 10/2014 | Zhang | | H04B 7/0689 |
| | | | | 370/252 |
| 2015/0116164 A1* | 4/2015 | Mannion | | G01R 29/10 |
| | | | | 343/703 |
| 2015/0146215 A1* | 5/2015 | Kobayashi | | G01B 11/2504 |
| | | | | 356/610 |
| 2015/0177301 A1* | 6/2015 | Kajbaf | | G01R 29/0892 |
| | | | | 324/613 |
| 2016/0359573 A1* | 12/2016 | Pauly | | H04B 17/12 |
| 2017/0068771 A1* | 3/2017 | Muchaidze | | G06F 17/5081 |
| 2017/0093509 A1* | 3/2017 | Kyosti | | H04L 25/0206 |
| 2017/0223559 A1* | 8/2017 | Kong | | H04W 24/06 |
| 2017/0276471 A1* | 9/2017 | Jiang | | G01B 9/02004 |
| 2017/0338550 A1* | 11/2017 | Alon | | H04B 17/102 |
| 2017/0339335 A1* | 11/2017 | Kuokkanen | | H04N 5/2256 |
| 2018/0027434 A1* | 1/2018 | Foegelle | | H04B 7/0617 |
| | | | | 455/67.13 |
| 2018/0041289 A1* | 2/2018 | Pabst | | H04B 17/103 |
| 2018/0080968 A1* | 3/2018 | Qi | | G01R 29/10 |
| 2018/0205821 A1* | 7/2018 | Rowell | | H04M 3/28 |
| 2018/0287721 A1* | 10/2018 | Vikstedt | | G01R 29/0814 |
| 2018/0321292 A1* | 11/2018 | Bartko | | G01R 29/0821 |
| 2018/0321301 A1* | 11/2018 | Harteneck | | H04B 17/104 |
| 2018/0340966 A1* | 11/2018 | Schmitz | | G01R 29/10 |
| 2018/0368011 A1* | 12/2018 | Foegelle | | H04B 7/0617 |
| 2019/0025358 A1* | 1/2019 | Rowell | | G01R 29/105 |
| 2019/0109653 A1* | 4/2019 | Tankielun | | H04B 17/103 |

* cited by examiner

METHOD AND SYSTEM FOR TESTING BEAM FORMING CAPABILITIES OF WIRELESS DEVICES

CROSS REFERENCE TO RELATED APPLICATIONS

This application is a continuation of U.S. Utility application Ser. No. 15/892,042, filed Feb. 8, 2018, which claims priority of U.S. Provisional Application Ser. No. 62/480,937 filed on Apr. 3, 2017, which is incorporated herein in its entirety by reference.

FIELD

This disclosure relates to electromagnetic measurement systems, and in particular to an improved system and method for testing beam forming capabilities of a wireless device.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figure 1:
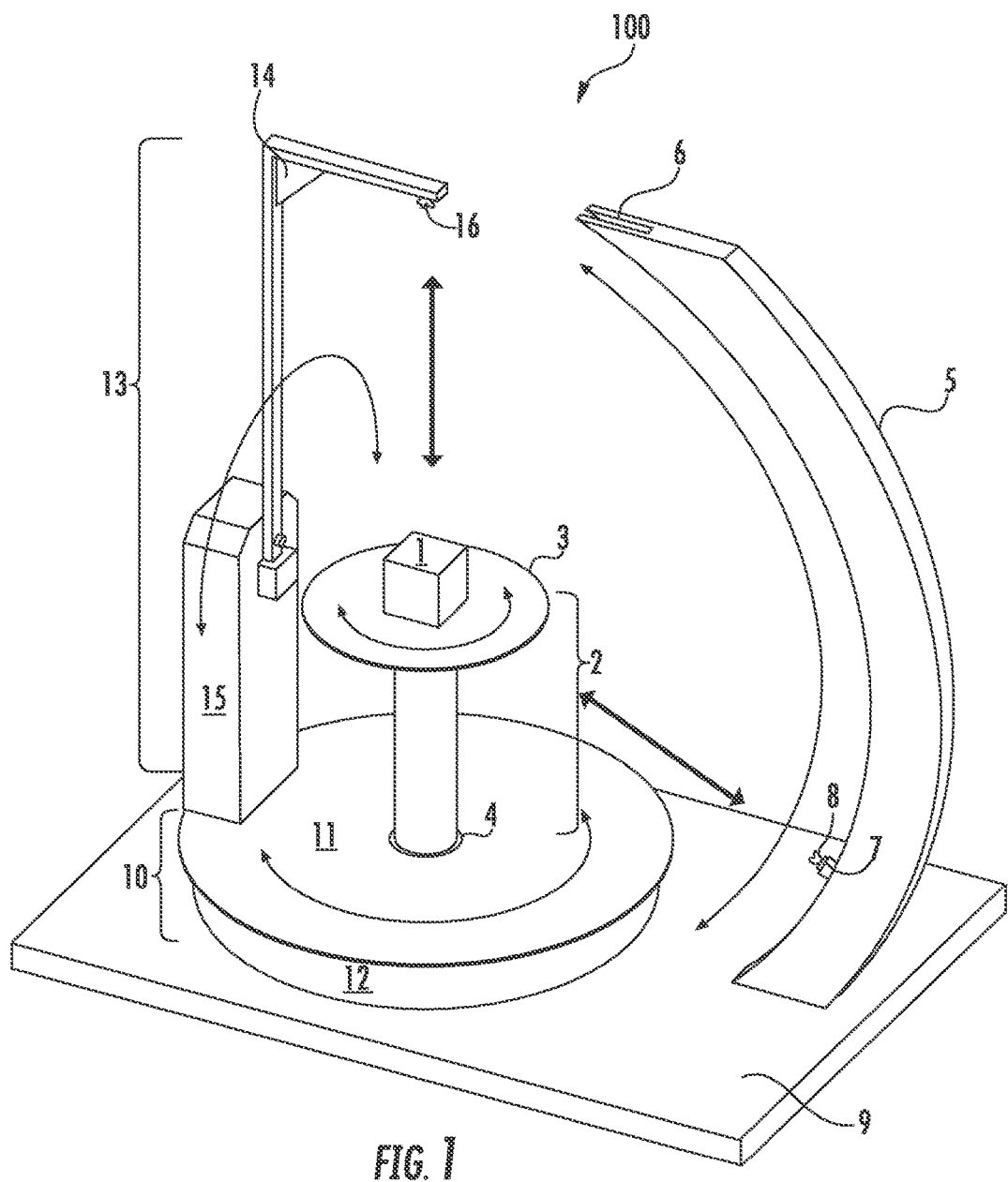
FIG. 1 is a perspective view of a positioning system for testing the beam forming capabilities of wireless devices

Before describing in detail exemplary embodiments, it is noted that the embodiments reside primarily in combinations of apparatus components and processing steps related to testing beam forming capabilities of wireless devices. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

FIG. 1 is a perspective view of an electromagnetic measurement apparatus 100 for testing a device under test (DUT) 1 such as a wireless device. A first single axis rotational positioner 2, such as a turntable, is configured to mount thereon the device 1 to be tested, the first positioner 2 having a support structure 3 being rotatable relative to a base structure 4 about first axis of rotation passing through the center of a test volume containing the DUT 1. Note that in some embodiments, the positioner 2 may be other than a pedestal, such as a platform or other structure to which the DUT may be attached or upon which the DUT may be secured.

In the embodiment of FIG. 1, a second single axis positioner 5 is configured with a second axis of rotation that is orthogonal to the axis of rotation of the first positioner 2. Further, the second axis of rotation of the second positioner 5 intersects the first axis of rotation of the first positioner 2 at a center of the test volume containing the DUT 1. In some embodiments positioner 5 may consist of an arched track 6 along which a moveable carrier 7 can rotate relative to the arched track 6 about the axis of the second positioner 5. Moveable carrier 7 holds a first antenna 8. In some embodiments, the second positioner 5 may be attached to the base 4 of the first positioner 2 or other support structure. However, in the embodiment shown in FIG. 1, the second positioner 5 is affixed to the floor 9. First antenna 8 is attached to the carrier 7 such that the first antenna can move about the second axis relative to the arched track 7 and base 4. Through the combined movements of the orthogonal positioners 2 and 5, antenna 8 may be placed at any desired position about the DUT 1.

A third single axis rotational positioner 10 includes a turntable top 11 and base 12 that can move relative to one another about a third axis of rotation coinciding with the first axis of rotation of the first positioner 2. One side of the positioner 10 may be attached such that the other side of the positioner 10 can move relative to the support structure 2 and DUT 1. In some embodiments, the base 12 of the positioner 10 is attached to the floor 9, which is also attached to the base 4 of the positioner 2. In some embodiments, the base 4 of the positioner 2 may be attached to the top 11 of the positioner 10 and the base 12 of the positioner 10 is then attached to the floor 9 or other support structure. Various other stacking approaches are possible to provide at least two degrees of rotational motion of the DUT 1.

A fourth single axis rotational positioner 13 is configured with an axis of rotation that is orthogonal to and intersects the rotational axis of the first and third positioners 2, 10, that pass through the center of the test volume. In some embodiments, the positioner 13 includes a supporting arm 14 attached to a base 15 such that the supporting arm 14 rotates with respect to the base 15 about a fourth axis that may be orthogonal to the axis of rotation of the positioners 2 and 19. The base 15 of the positioner 13 may be attached to the top 11 of the positioner 10 so that the positioner 13 moves relative to the DUT 1 and the positioner 5 when the positioner 10 moves. A measurement antenna 16 is attached to the support arm 14 such that the antenna 16 can move about the fourth axis relative to the base 15 and the positioner 10. Through the combined action of the orthogonal positioners 10 and 13, the antenna 16 can be placed at any desired position about the DUT 1. Through the combined action of all of the positioners, the antennas 8 and 16 may be placed in any desired position about the DUT 1 and relative to each other. Thus, the apparatus 100 can test the DUT 2 by radiating from one direction from a first antenna 8 and receiving from another direction via a second antenna 16, or vice versa. The apparatus 100 can also test the DUT 2 by transmitting and/or receiving from each one of a plurality of measurement antennas.

In some embodiments, a dual polarized antenna may be used to measure two orthogonal polarizations either simultaneously or sequentially. Note that the DUT 1 may be a wireless device to be tested and, more particularly, may be a wireless phone, laptop, access point, tablet, base station or any device that communicates wirelessly with another wireless device. Note also that the apparatus 100 may be placed in an anechoic chamber and may have RF absorber attached to various parts of the apparatus 100.

Figure 2:
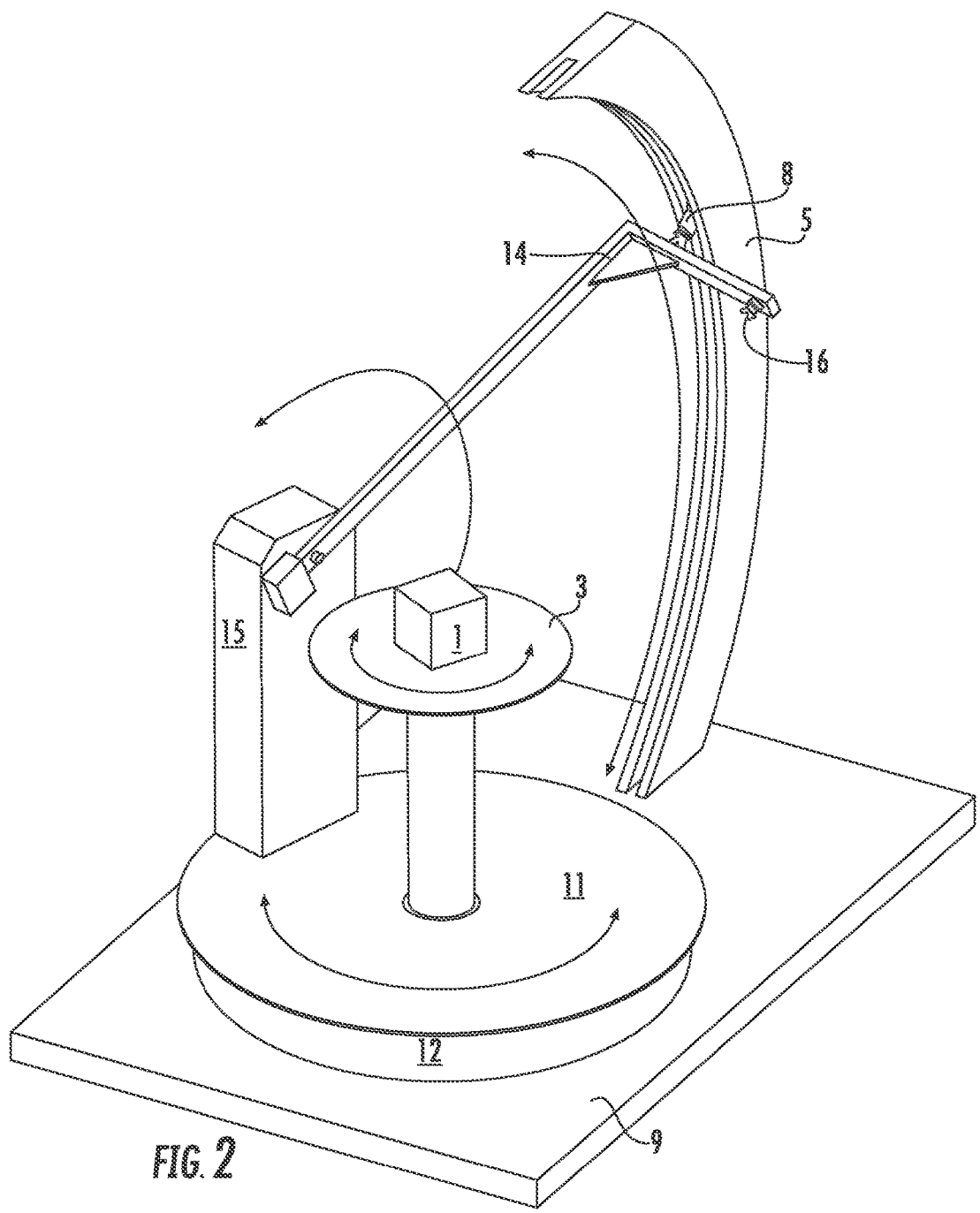
FIG. 2 is an illustration of potential interference between an antenna positioner and an antenna.
Figure 3:
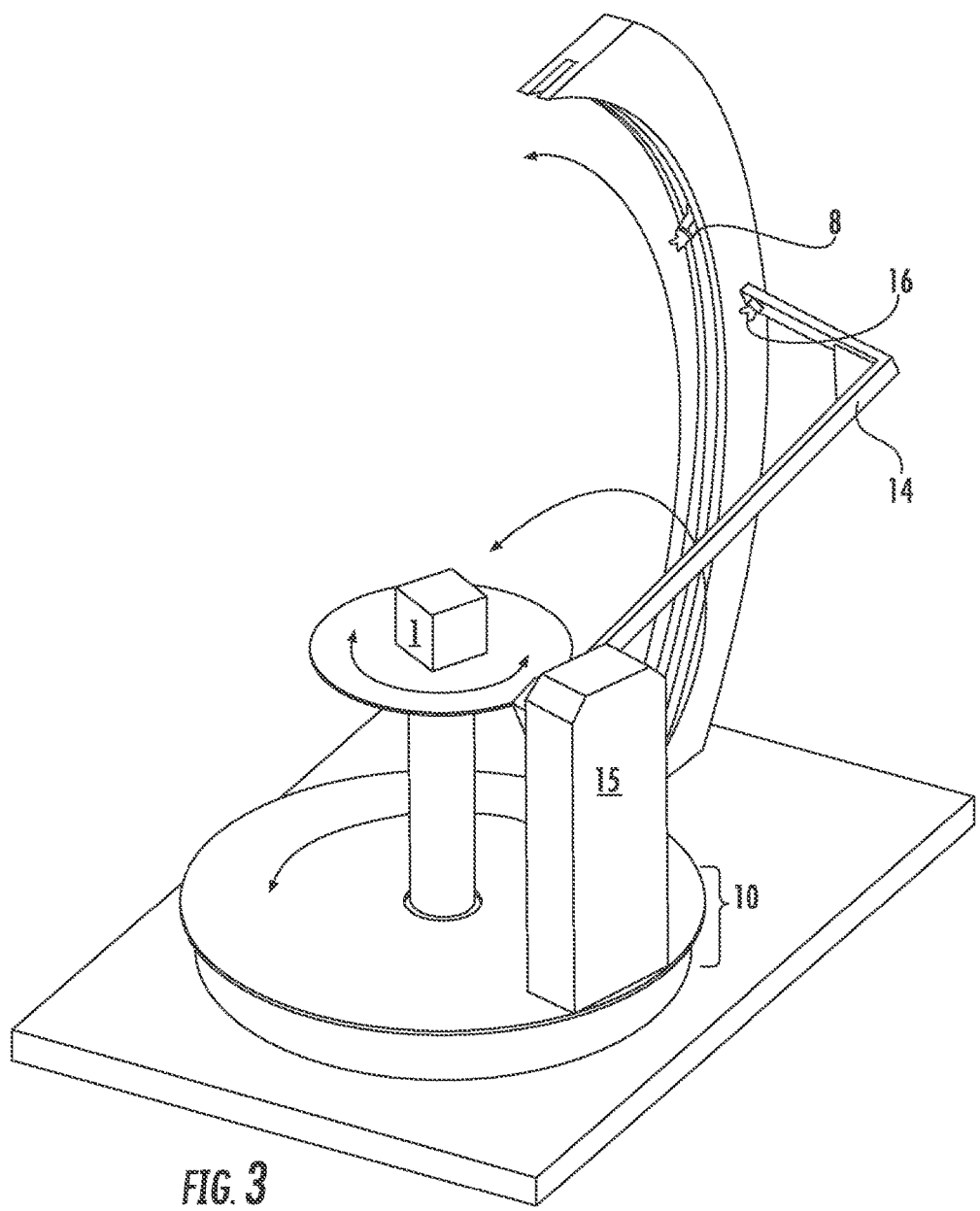
FIG. 3 is an illustration of how to avoid the interference shown in FIG. 2.

FIG. 2 shows a potential interference when the support arm 14 of the positioner 13 blocks the antenna 8 on the carrier 7 of the positioner 5. FIG. 3 shows that by rotating the positioner 10 opposite the direction of FIG. 2, it is possible to achieve the same position of the antenna 16 as shown in FIG. 2, but without blocking the antenna 8. There is a 180 degree phase shift in the signal received by antenna 16 by moving between the configuration shown in FIG. 2 and the configuration shown in FIG. 3. This phase shift can be accounted for in an algorithm that determines relative positions to achieve a given set of angles ($\phi$, $\theta$). Also, persons of ordinary skill in the art of electromagnetic measurement systems will recognize that relative motion between two parts A and B, can be achieved by moving part A relative to part B or vice versa. For example, the DUT can move relative to an antenna, and/or an antenna can move relative to the DUT.

Figure 4:
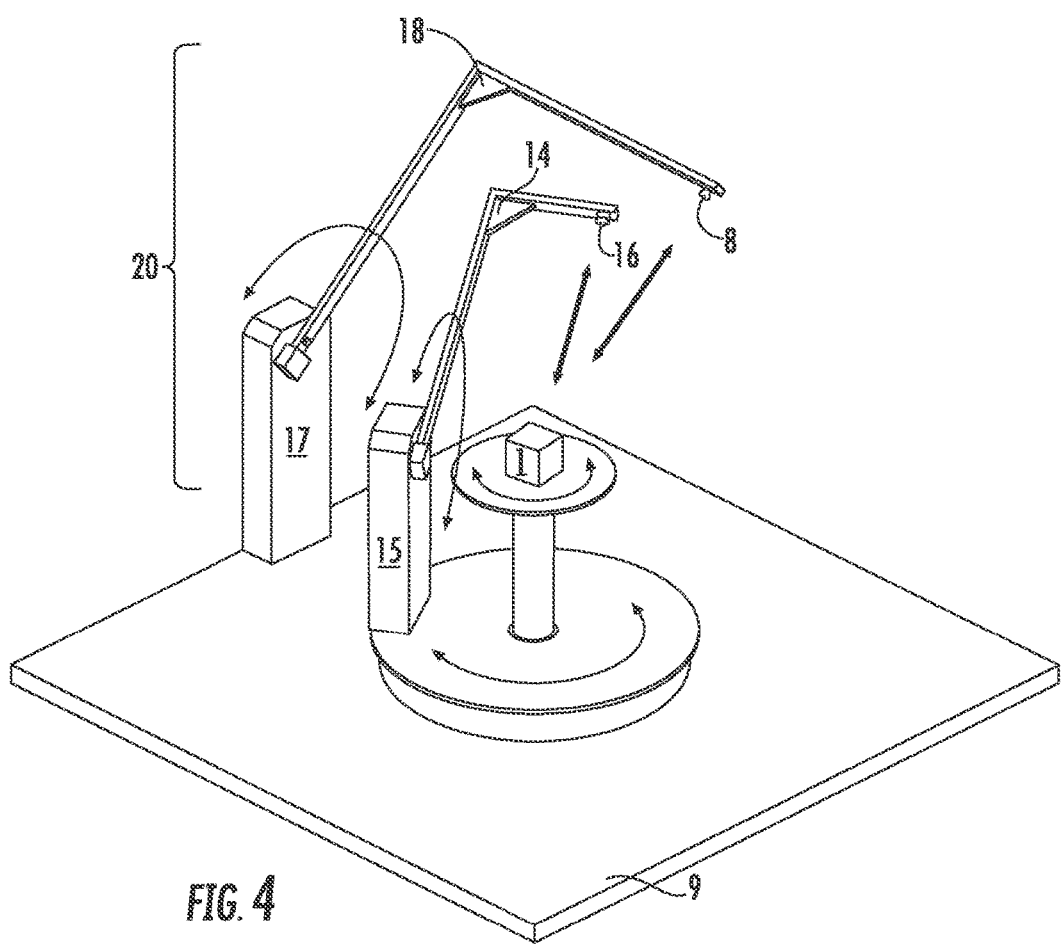
FIG. 4 is an illustration of an alternative positioning system for testing beam forming capabilities of wireless device.

FIG. 4 shows an alternative embodiment of a test apparatus 100 where the positioner 5 of FIG. 1 is replaced by a single axis rotational positioner 20 having a base 17 and a support arm 18, which carries an antenna 8. In some embodiments, the support arm 18 rotates about an axis that is orthogonal to an axis of rotation of the positioners 2 and 10. The base structure 17 may be fixed to the floor 9.

Figure 5:
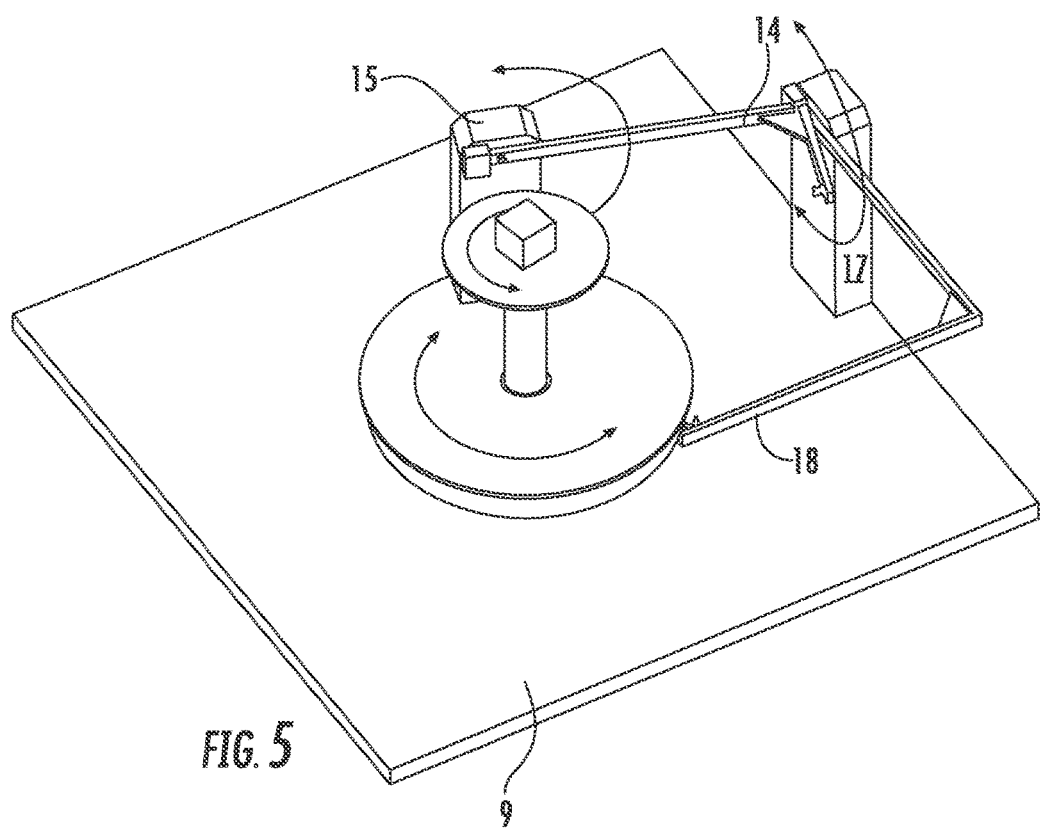
FIG. 5 is an illustration of potential interference between a first antenna positioner a second antenna positioner and or a base structure.
Figure 6:
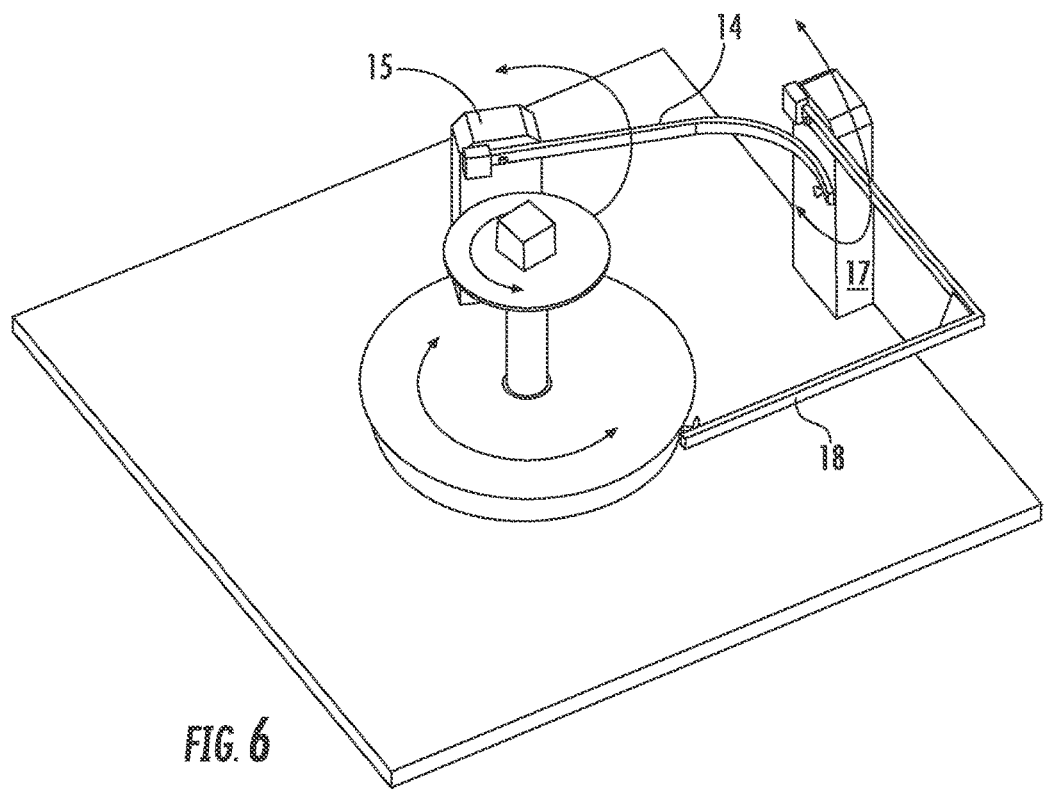
FIG. 6 is an illustration of how to avoid the interference shown in FIG. 5.

FIG. 5 shows a potential interference when the first support arm 14 of the positioner 13 interferes with one of the base structure 17 and the second support arm 18 of the positioner 20. This interference might be avoided by rotating the second support arm 14 by about 180 degrees in the opposite direction and rotating the positioner 10 by about 180 degrees. However, that may still lead to an interference between the outer antenna and the inner positioner 13. Thus, the positioner 13 may be modified to handle clearance in all directions since it may not be possible to find an alternate position for a mechanical contact point without introducing a shadowing position. Another embodiment that overcomes potential mechanical interference is shown in FIG. 6. As shown in FIG. 6, the support arm 14 is curved to avoid striking the base 17 or support arm 18. Similarly, the second support arm 18 may also be curved. In addition, or alternatively, the base structures 15 and 17 may be spaced apart to avoid mechanical interference between the first and second support arms 14 and 18.

Note that the moveable elements of the different positioners 2, 10, 13 and 20 may each be driven mechanically by a motor and or mechanical linkage to a motor. The motors and mechanical linkage may be controlled by a computer operating under the directions of software. The computer may execute an algorithm that positions the antennas so as to avoid mechanical interference.

Figure 7:
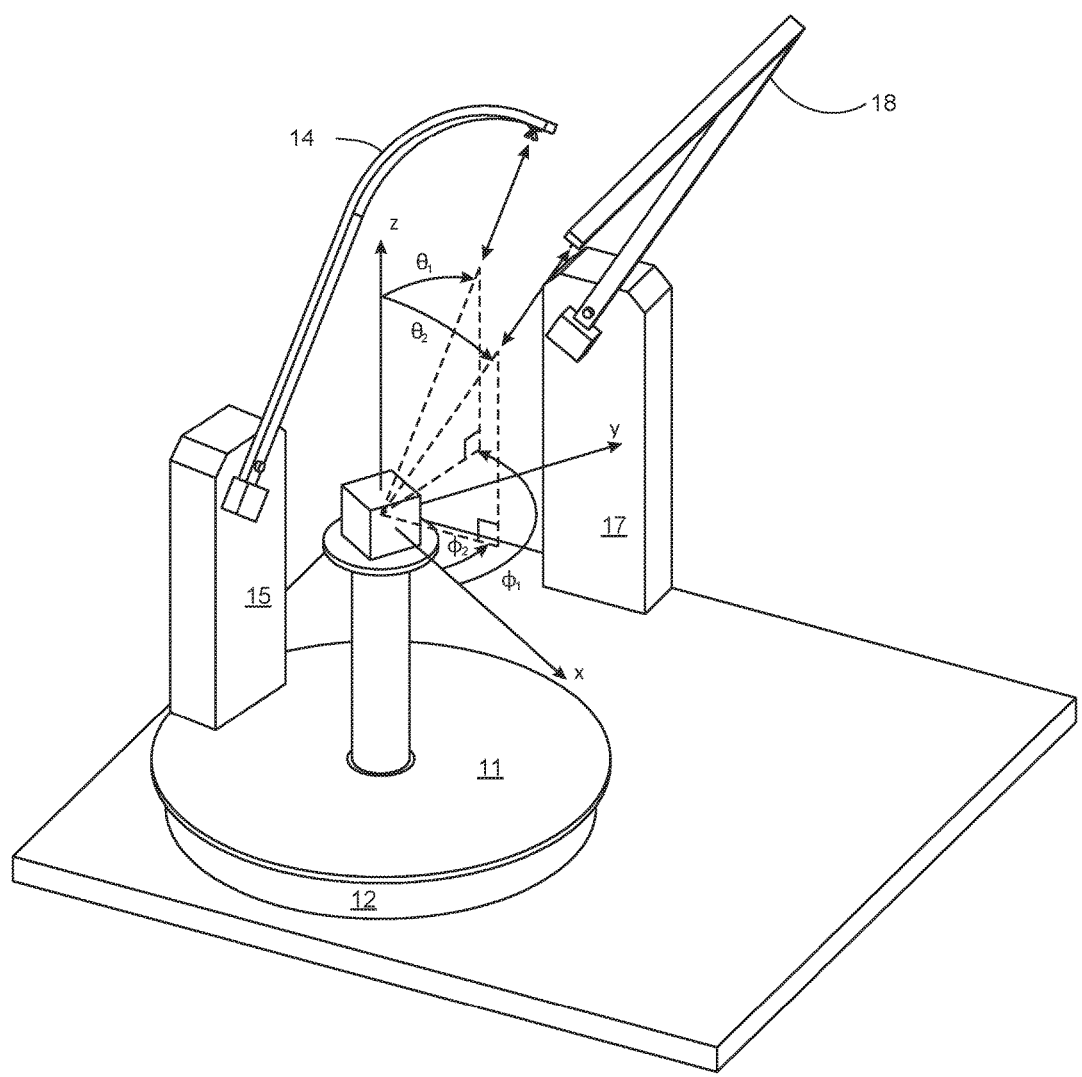
FIG. 7 is an illustration of a coordinated system for which angles of rotation are shown.

FIG. 7 illustrates positioning of the antennas 8 and 16 specified by the angles $\theta_1$, $\theta_2$, $\phi_1$ and $\phi_2$ relative to the DUT. The angle $\theta_2$ corresponds to a clockwise (or counterclockwise) rotation of the support structure 3, and $\theta_2$ corresponds to a clockwise (or counterclockwise) rotation of the support arm 18. Defining $\phi'$ as the clockwise rotation of the positioner 2 and $\theta'$ as the clockwise rotation of the support arm 14 mounted on the positioner 20, then by default, $\theta'=\theta_1$ and $\phi'=\phi_2-\phi_1$. However, the same physical antenna position can be defined as $\theta'=-\theta_1$ and $\phi'\phi_2-\phi_1\pm180°$. The choice of which of the two possible orientations should be used depends on the interference potential of the support arm 14 with the support arm 18 or base 17 and, for the right-handed coordinate system illustrated in FIG. 7, can be chosen according to the following pseudo code algorithm:

phi_p=phi_2-phi_1;

theta_p=theta_1;

while (phi_p>180){phi_p=phi_p-360;} while (phi_p<-180){phi_p=phi_p+360;} if (phi_p>0){phi_p=phi_p-180; theta_p=-theta_1;} where phi_p=$\phi'$, phi_2-phi_1=$\phi_2-\phi_1$, theta_p=$\theta'$, and theta_1=$\theta_1$.

Figure 8:
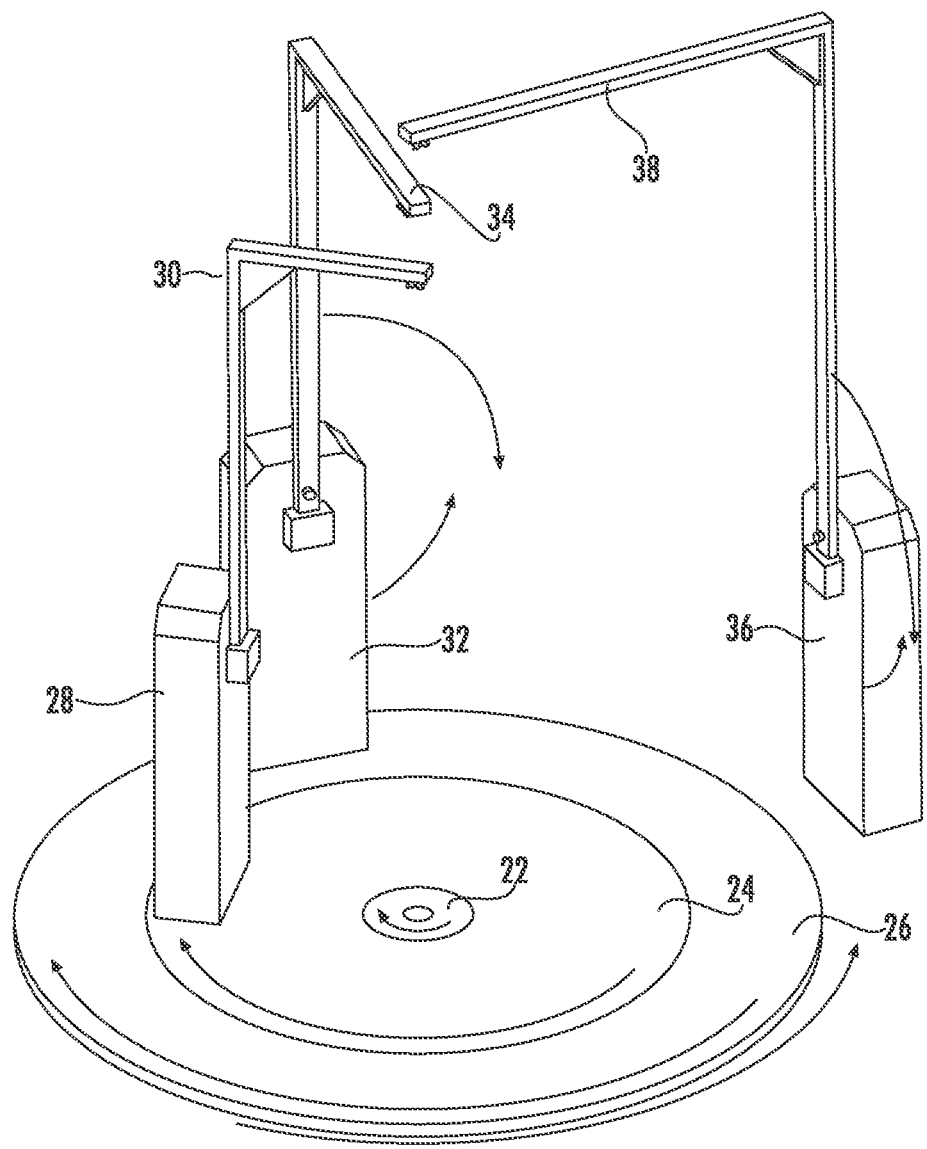
FIG. 8 is an illustration of an alternative positioning system.
Figure 9:
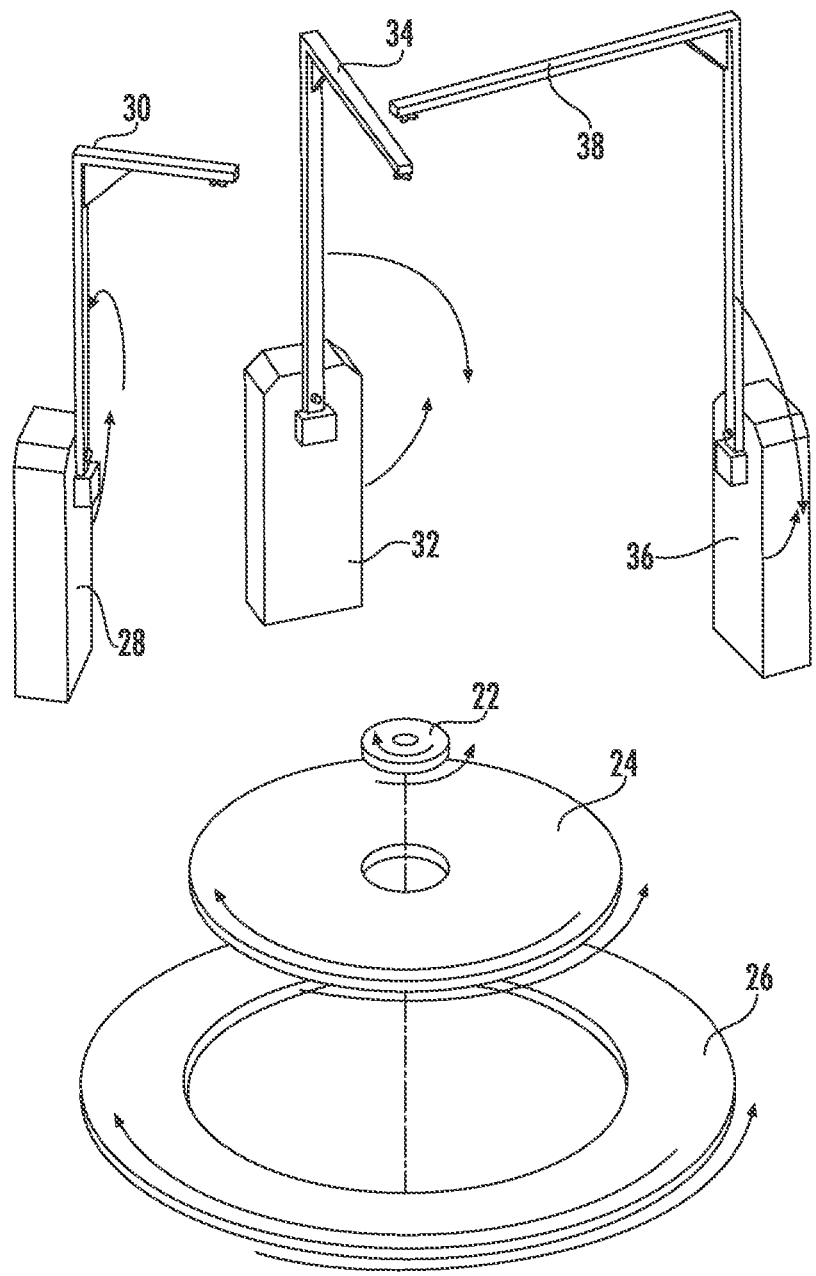
FIG. 9 is an exploded view of the positioning system of FIG. 8.

FIG. 8 illustrates another embodiment of a positioning system having a first positioner 22, a second positioner 24, a third positioner 26, a fourth positioner consisting of a base 28 and support arm 30, a fifth positioner consisting of a base 32 and a support arm 34, and a sixth positioner consisting of a base 36 and support arm 38. Each support arm is configured to support an antenna. The fourth positioner is mounted on the second positioner 24 and rotates as the second positioner 24 rotates. The fifth positioner is mounted on the third positioner 26 and rotates as the third positioner 26 rotates. In some embodiments, the base 36 of the sixth positioner may be fixed to the floor of a test facility. FIG. 9 shows an exploded view of the configuration of FIG. 8 which illustrates multiple degrees of motion. In FIG. 9, the first 22, second 24, and third 26 positioners include concentric annular rings, the first annular ring 22 fitting within the second annular ring 24 which fits within the third annular ring 26.

Figure 10:
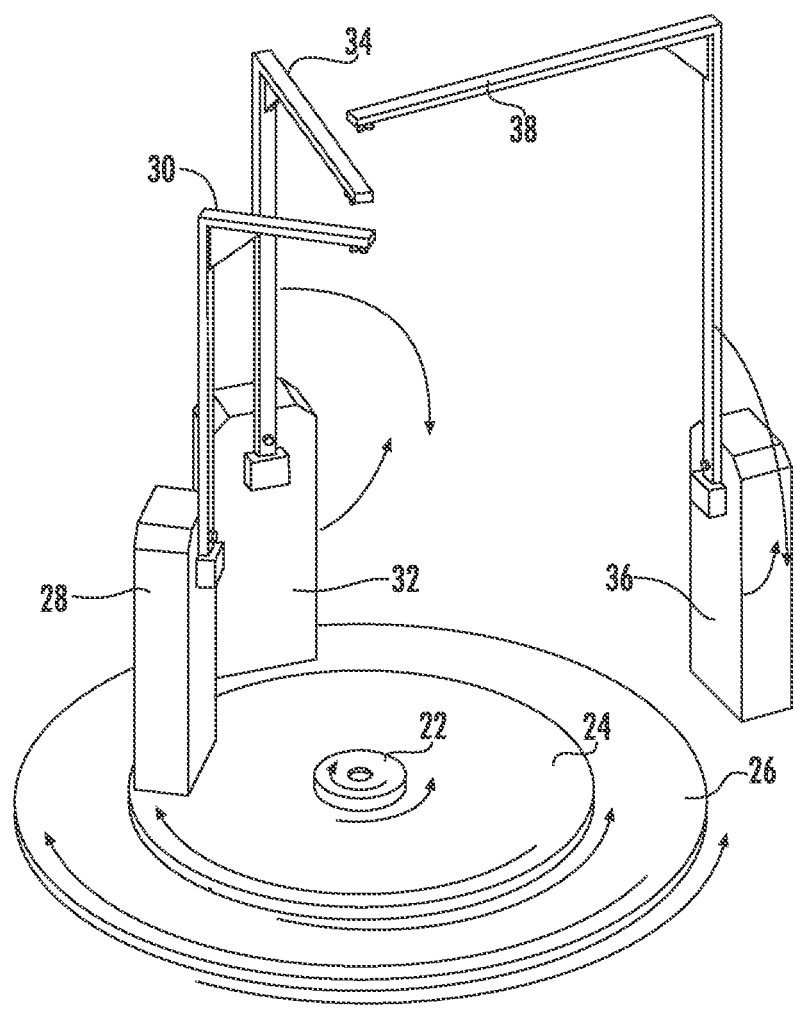
FIG. 10 is an illustration of another alternative positioning system.
Figure 11:
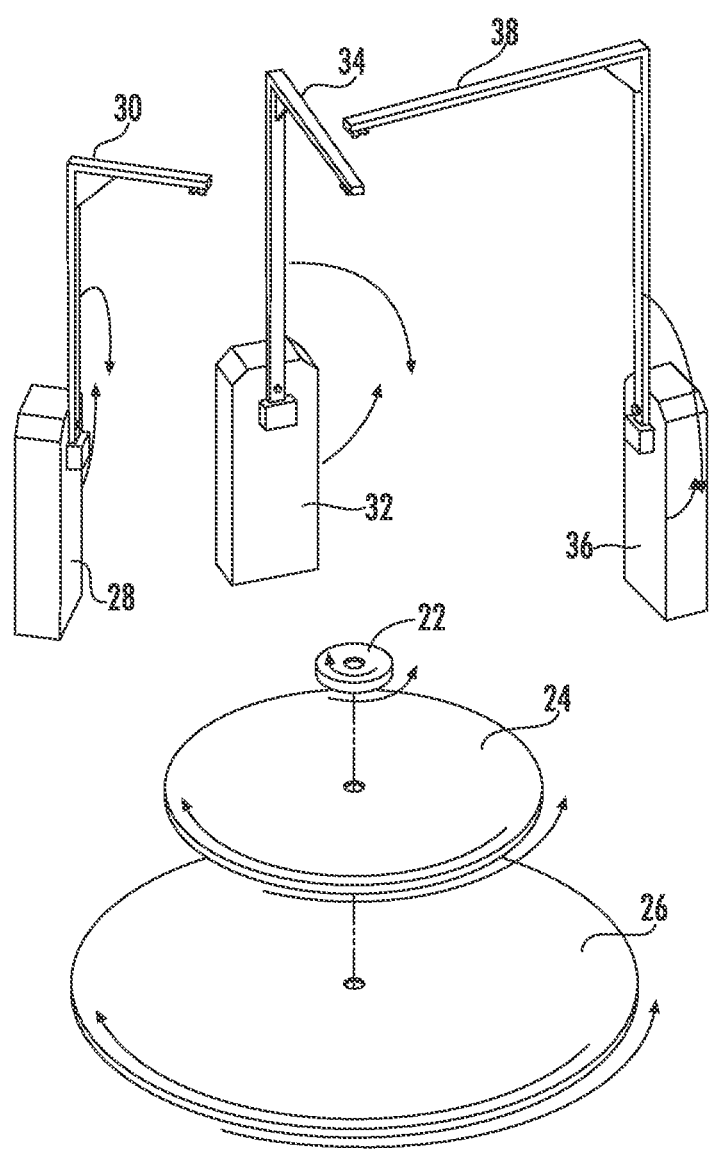
FIG. 11 is an exploded view of the positioning system of FIG. 10.

In contrast, FIG. 10 shows an alternative configuration where the first positioner 22, the second positioner 24 and the third positioner 26 are stacked. FIG. 11 shows an exploded view of the configuration of FIG. 11. In some embodiments, rotation of the third positioner 26 causes rotation of the second positioner 24 and the first positioner 22. In some embodiments, rotation of the second positioner 24 causes rotation of the first positioner 22. Thus, rotation of the positioners 22, 24 and 26, may be independent and/or differential.

Note that although the fourth positioner and the fifth positioner are shown having bases 28 and 32 and support arms 30 and 34, respectively, persons having ordinary skill in the art will recognize that these positioners may take different forms that equivalently provide freedom of motion of an antenna in a theta direction while being subject to motion in a phi direction. Thus, generally, these support structures may be referred to as positioners or may be referred to as having or supporting an antenna positioner. Note also that although the first, second and third support structures are shown as turntables, or including turntables, persons having ordinary skill in the art will recognize that these support structures may take different forms that equivalently provide freedom of motion in a phi direction while supporting one of the bases 28 and 32. Persons of ordinary skill in the art will further recognize that gearing and mechanical assemblies that facilitate motion of the support structures driven by motors, for example, can be provided given the disclosure herein.

Note further that although the first, second and fourth support structures are shown to be concentric and share a common axis, other embodiments may be constructed with one support structure being offset with respect to another support structure.

Thus, for example, in some embodiments a first positioner with a first axis moves a DUT relative to a second positioner with a second axis that holds a first antenna. A third positioner may be introduced that moves relative to one or both of the first and second positioner and holds a second antenna. Additional positioners and antennas can be added as space permits.

Figure 12:
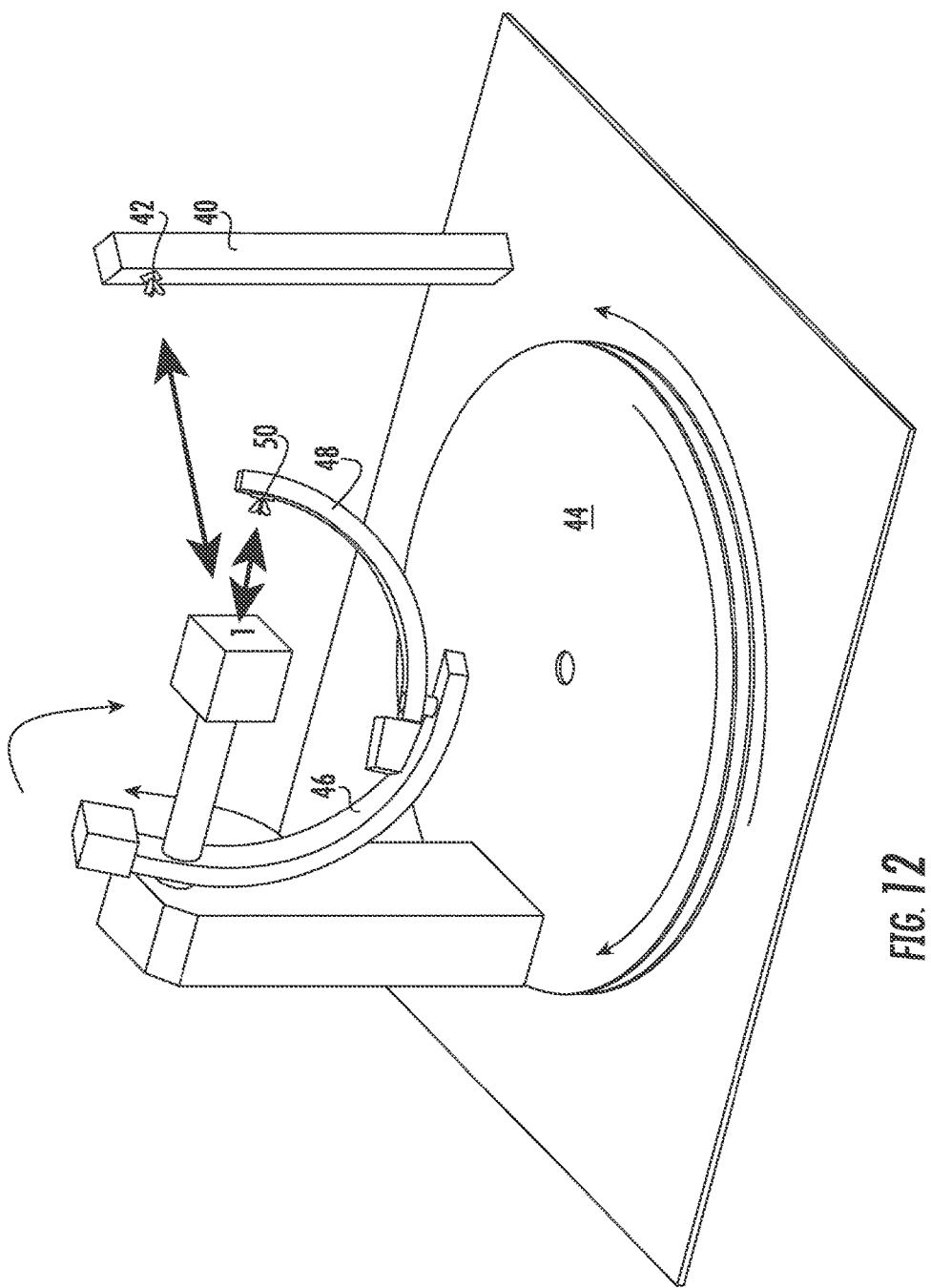
FIG. 12 is an illustration of another alternative positioning system.

FIG. 12 is an illustration of another alternative positioning system where the spherical coordinate system has been rotated with respect to a fixed reference. The positioning system of FIG. 12 includes a stationary positioner 40 having an antenna 42. A rotating platform 44 provides rotation of a second positioner 46 as well as rotation of the DUT 1. A third positioner 48 is rotatably affixed to the second positioner 46 which holds an antenna 50. This positioner also provides multiple degrees of freedom of motion of the antennas about the DUT.

In addition, while it is convenient to have the different spherical positioning systems share a common phi axis in order to maintain a common coordinate system, it is not necessary that they be concentric/coaxial. Completely independent spherical positioning systems with differing coordinate systems $(\theta_1, \phi_1)$ and $(\theta_2, \phi_2)$ such that $\Delta\theta \neq \theta_1 - \theta_2$ and $\Delta\phi \neq \phi_1 - \phi_2$ may still be used for full spherical coverage with relative differences being determined using appropriate spherical coordinate transformations. Note too that the coordinate transformations may be applied in real time such that while target positions are defined in a common spherical coordinate system, the required angles associated with each positioner may not correspond to individual theta or phi coordinates (i.e. there is not a specific theta positioner or phi positioner). In fact, it is not even necessary that any two positioners for a given coordinate system be orthogonal, provided that the net set of positions accessible by the combined positioning system covers the desired surface about the DUT. However, the use of an arbitrary positioning system may impact the definition of polarizations and require the rotation of the polarization direction either electrically or mechanically to satisfy a desired arbitrary polarization direction. Thus, in some embodiments, electrically controlling the relative magnitude and phase of signals fed to a dual polarized antenna element in order to produce any desired arbitrary elliptical polarization may be provided.

Figure 13:
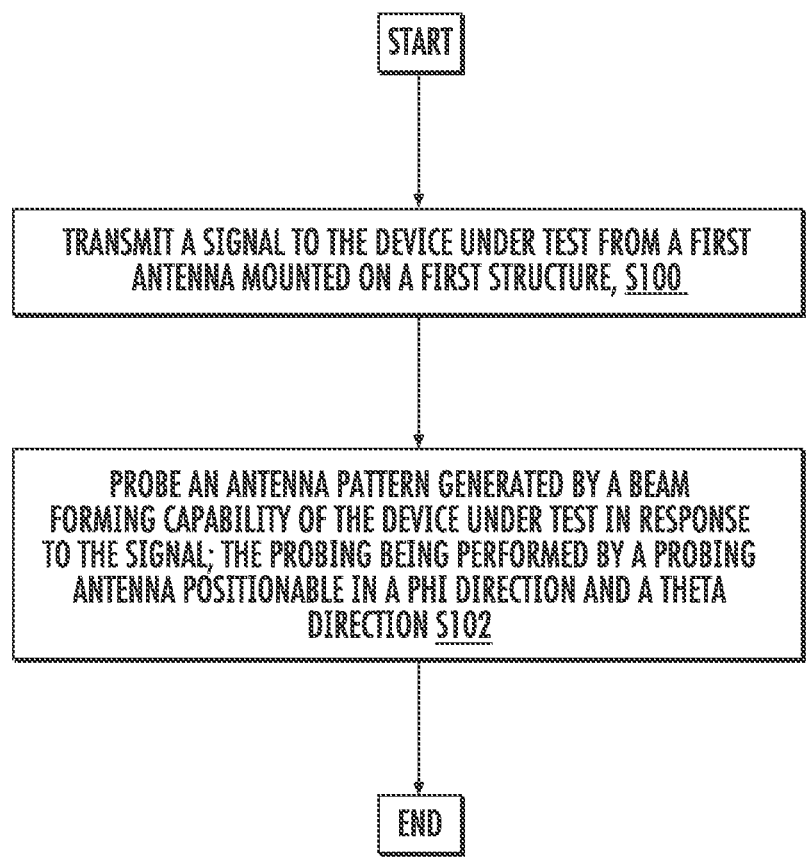
FIG. 13 is flow chart of an exemplary process for testing beam forming capabilities of a wireless device.

FIG. 13 is a flowchart of an exemplary process for measuring beam forming capabilities of a wireless device. The process includes transmitting a signal to the DUT from a first antenna mounted on a first positioner (block S100). The process also includes probing an antenna pattern generated by a beam forming capability of the wireless device in response to the transmitted signal, the probing performed by a probe antenna by rotating the probe antenna 16 in at least one of a phi direction about the wireless device and a theta direction (block S102). Rotating the probe antenna in the phi direction may involve rotating the probe antenna about an axis passing through the wireless device. Rotating the probe antenna in the theta direction may involve rotating the probe antenna 5 about an axis that is orthogonal to an axis passing through the wireless device.

Thus, in some embodiments, the positioning system 100 may be used to measure power radiated by the DUT and may further be used to provide by one of antennas 8 and 16 an interferer and determine the DUT response to the interferer, including an ability of the DUT to overcome the interference. Other measurements may be facilitated by these apparatus. Note that although position may be expressed in terms of spherical coordinates, embodiments are not so limited.

Figure 14:
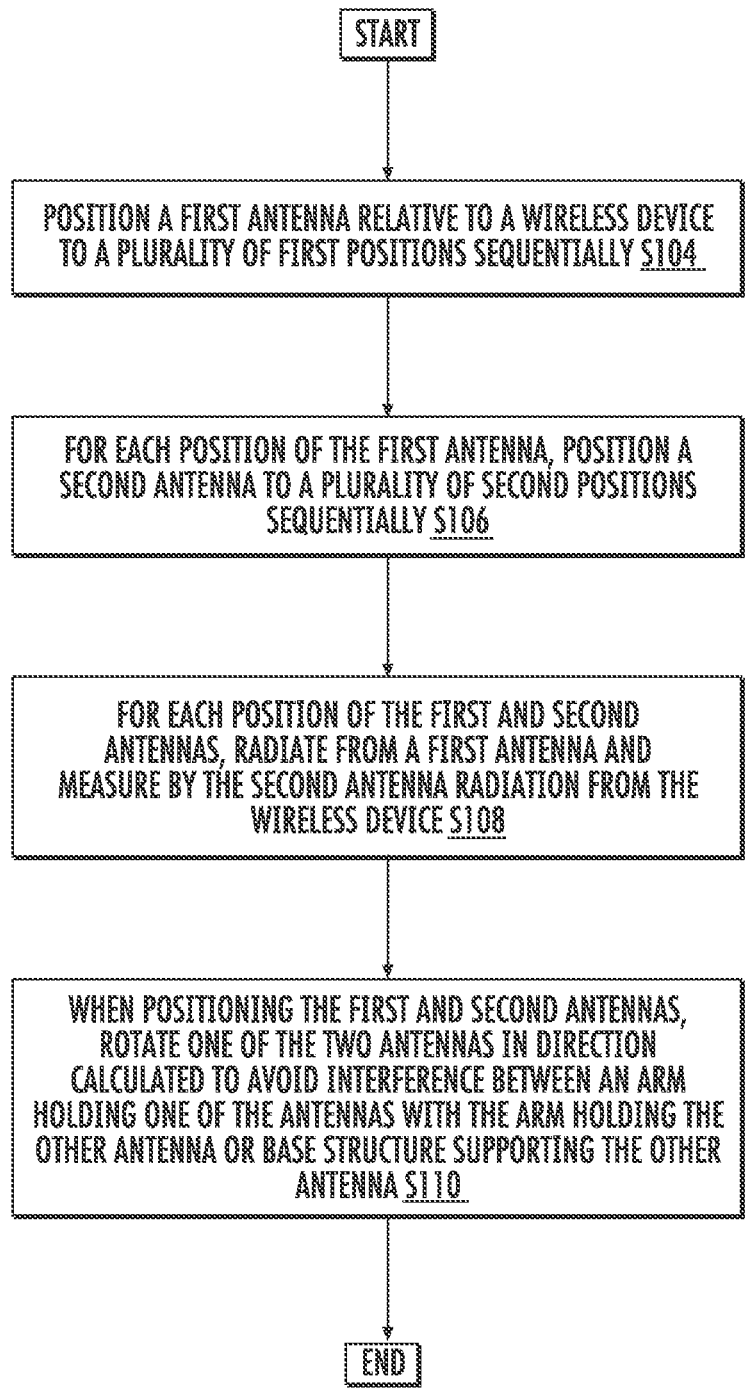
FIG. 14 is a flow chart of an exemplary process for testing beam forming capabilities of a wireless device, while avoiding interference as described herein.

FIG. 14 is a flowchart of an exemplary process for measuring beam forming capability of a device under test (DUT). The process includes positioning a first antenna relative to the DUT to a plurality of first positions sequentially (block S104). The process also includes, for each position of the first antenna, positioning a second antenna to a plurality of second positions sequentially (block S106). For each position of the first and second antennas, the process also includes radiating from a first antenna, and measuring by the second antenna radiation from the wireless device (block S108). When positioning the first and second antennas, respectively, the positioner holding one antenna may be rotated in a direction calculated to avoid interference between the support arm of one positioner and the support arm and base of another positioner (block S110).

It should be obvious to those skilled in the art that appropriate RF/wireless test equipment may be attached to the antennas 8 and 16 either directly or via RF cables routed through the positioning system(s) and that said test equipment may be automated in conjunction with the aforementioned positioners to provide any desired wireless test.

Thus, some embodiments include a positioning system for use in testing a device under test, DUT, the positioning system configured to position at least two antennas. The positioning system includes a support structure on which to position the DUT. The positioning system also includes a first antenna positioner capable of motion relative to the DUT about two axes of a first set of axes and constructed to hold a first of the at least two antennas such that the first of the at least two antennas is moveable relative to the DUT about the two axes of the first set of axes. The positioning system includes a second antenna positioner capable of motion relative to the DUT about two axes of a second set of axes and constructed to hold a second of the at least two antennas such that the second of the at least two antennas is moveable relative to the DUT about the two axes of the second set of axes.

In some embodiments, the support structure upon which the DUT is positioned is moveable about at least one axis. In some embodiments, the two axes of the first set of axes are orthogonal. In some embodiments, a position of the first of the at least two antennas is fixed relative to a fixed reference frame. In some embodiments, the DUT is fixed relative to a fixed reference frame. In some embodiments, motion of the first antenna positioner relative to the DUT about two axes includes rotation about an axis passing through a test volume. In some embodiments, motion of the second antenna positioner relative to the DUT about two axes includes rotation about an axis orthogonal to the axis passing through the test volume. In some embodiments, the first positioner is capable of motion relative to the DUT about only two axes. In some embodiments, the first positioner is constructed to hold the first of the at least two antennas so that the first of the at least two antennas is rotatable about an axis passing there through to achieve a selected polarization of the first of the at least two antennas.

In some embodiments, a positioning system for use in testing a device under test, DUT, the positioning system configured to position at least two antennas, is provided. The system includes a support structure on which to position the DUT, the support structure capable of motion about at least one axis relative to a fixed reference frame. The positioning system also includes a first antenna positioner capable of motion relative to the DUT about at least two axes and constructed to hold a first of the at least two antennas such that the first of the at least two antennas is moveable relative to the DUT about the at least two axes. The positioning system also includes a second antenna positioner fixed with respect to a fixed reference frame and constructed to hold a second of the at least two antennas directed toward a test volume where is located the DUT.

In some embodiments, motion of the first antenna positioner relative to the DUT about two axes includes rotation about an axis passing through a test volume. In some embodiments, the support structure is capable of rotation about an axis passing through a test volume. In some embodiments, the support structure is capable of motion about two axis. In some embodiments, the first positioner is capable of motion relative to the DUT about only two axes.

In some embodiments, a positioning system for use in testing a device under test, DUT, the positioning system configured to position at least two antennas, is provided. The positioning system includes a first positioner configured to support the DUT and a first of the at least two antennas and configured to provide relative motion between the first of the at least two antennas and the DUT. The positioning system also includes a second positioner configured to support a second of the at least two antennas and configured to provide relative motion between the second of the at least two antennas and at least one of the DUT and the first of the least two antennas. In some embodiments, the first positioner is configured to provide relative rotational motion between the first of the at least two antennas and the DUT about at least a first axis. In some embodiments, the second positioner is configured to provide relative rotational motion between the second of the at least two antennas and the DUT about at least a second axis. In some embodiments, the second axis is orthogonal to the first axis. In some embodiments, the first positioner includes a first support structure configured to support the DUT and to rotate about a first axis passing through the DUT, and includes a second support structure configured to support the first of the at least two antennas and to rotate such that the first of the at least two antennas is rotatable about a second axis orthogonal to the first axis. In some embodiments, the second positioner includes a base structure configured to support a positioner arm, the positioner arm configured to hold the second of the at least two antennas and to rotate about the second axis. In some embodiments, the first positioner is configured such that the DUT is fixed relative to a fixed reference frame. In some embodiments, at least one of the at least two antennas is rotatable about an axis passing there through to adjust a polarization orientation of the at least one antenna.

Some embodiments include:

Embodiment 1

An electromagnetic measurement apparatus for testing a wireless device, the apparatus comprising:

a first structure configured to mount thereon the device to be tested, the first structure rotatable about a z axis, the z axis being perpendicular to a x-y plane in a rectangular coordinate system;
a platform concentric with the z axis about which the first structure rotates, the platform rotatable about the z axis independently of rotation of the first structure;
a first arm mounted on the platform and moveable with the platform when the platform rotates, the first arm being rotatable in a plane that is parallel to the z axis;
a second arm that is stationary with respect to the x-y plane, the second arm having a moveable part that is moveable in an arc in an y-z plane that contains the z axis about which the first structure and platform are rotatable;
a first antenna being mounted on the first arm and directed toward a position of the device to be tested; and
a second antenna being mounted on the moving part and directed toward the position of the device to be tested.

Embodiment 2

The apparatus of Embodiment 1, further comprising:
a third arm stationary with respect to the pedestal and platform; and
an antenna mounted on the third arm and directed toward the device to be tested.

Embodiment 3

The apparatus of Embodiment 1, wherein the moveable part is configured to rotate about an axis passing through the moveable part and perpendicular to the y axis.

Embodiment 4

An electromagnetic measurement apparatus for testing a wireless device, the apparatus comprising:
a first structure configured to mount thereon the device to be tested;
a second structure configured to hold a first antenna, the second structure and the first structure being configured to enable relative motion between them, the relative motion involving rotation of at least one of the first structure and the second structure about an axis passing through the first structure; and
a third structure configured to hold a second antenna, the third structure having a fixed part that is stationary with respect to a first plane to which the axis passing through the first structure is perpendicular, the third structure having a moveable part to hold the second antenna, the moveable part moveable in a second plane that contains the axis passing through the first structure, the first plane and the second plane being perpendicular.

Embodiment 5

The apparatus of Embodiment 4, wherein the first structure is rotatable about the axis passing there through.

Embodiment 6

A method for measuring beam forming capabilities of a wireless device, the method comprising:
transmitting a signal to the wireless device from a first antenna; and probing an antenna pattern generated by a beam forming capability of the wireless device in response to the signal, the probing performed by a probe antenna by rotating the probe antenna in at least one of a phi direction about the wireless device and a theta direction.

Embodiment 7

The method of Embodiment 6, wherein rotating the probe antenna in the phi direction involves rotating the probe antenna about an axis passing through the wireless device.

Embodiment 8

The method of Embodiment 6, wherein rotating the probe antenna in the theta direction involves rotating the probe antenna about an axis that is perpendicular to an axis passing through the wireless device.

As will be appreciated by one of skill in the art, some of the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. A positioner system for use in testing a device under test, DUT, the positioning system configured to position at least one antenna about the DUT, the positioning system comprising:
   a turntable configured to hold the DUT at a first height, the turntable configured to rotate about a center axis;
   a first positioner that is concentric with the turntable and that rotates about the center axis and supports a first support unit that is fixed to a base of the first positioner so that the first support unit circles the DUT when the first positioner rotates about the center axis;
   the first support unit mounted on the first positioner and configured to circle the DUT as the first positioner rotates about the center axis, the first support unit having a first positioner arm that rotates about an axis passing through the first support unit; and
   the first positioner arm mounted on the first support unit and configured to rotate about the axis passing through the first support unit, the first positioner arm being configured to hold a first antenna so that when the first positioner arm rotates about the axis passing through the first support unit, the first antenna sweeps through an arc about the DUT.

2. The system of claim 1, further comprising a second support arm mounted independently of the first positioner and having a second antenna that is positionable on the second support arm to enable the second antenna to sweep through an arc about the DUT.

3. The system of claim 1, further comprising:
a second support unit mounted independently of the first positioner, the second support unit having a second positioner arm that rotates about an axis passing through the second support unit; and
the second positioner arm mounted on the second support unit and configured to rotate about the axis passing through the second support unit, the second positioner arm being configured to hold a second antenna so that when the second positioner arm rotates about the axis passing through the second support unit, the second antenna sweeps through an arc about the DUT.

4. The system of claim 3, further comprising
a third positioner that is concentric with the turntable and that rotates about the center axis and supports a third support unit that is fixed to a base of the third positioner so that the third support unit circles the DUT when the third positioner rotates about the center axis;
the third support unit mounted on the third positioner and configured to circle the DUT as the third positioner rotates about the center axis, the third support unit having a third positioner arm that rotates about an axis passing through the third support unit; and
the third positioner arm mounted on the third support unit and configured to rotate about the axis passing through the third support unit, the third positioner arm being configured to hold a third antenna so that when the third positioner arm rotates about the axis passing through the third support unit, the third antenna sweeps through an arc about the DUT.

5. A positioner system for use in testing a device under test, DUT, the positioning system configured to position at least one antenna about the DUT, the positioning system comprising:
a first turntable configured to rotate about a center axis and to hold the DUT;
a second turntable concentric with the first turntable and configured to rotate about the center axis and to hold a first antenna; and
a third turntable concentric with the second turntable and configured to rotate about the center axis and to hold a second antenna.

6. The system of claim 5, wherein the second turntable holds the first antenna via a first support arm that rotates about an axis that is perpendicular to the center axis.

7. The system of claim 6, wherein the third turntable holds the second antenna via a second support arm that rotates about an axis that is perpendicular to the center axis.

8. The system of claim 5, wherein the third turntable holds the second antenna via a second support arm that rotates about an axis that is perpendicular to the center axis.

* * * * *